US010763799B2

(12) United States Patent
Hoyerby

(10) Patent No.: US 10,763,799 B2
(45) Date of Patent: Sep. 1, 2020

(54) FLYING CAPACITOR VOLTAGE CONTROL IN AN AMPLIFIER

(71) Applicant: INFINEON TECHNOLOGIES AUSTRIA AG, Villach (AT)

(72) Inventor: Mikkel Hoyerby, Herlev (DK)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/217,621

(22) Filed: Dec. 12, 2018

(65) Prior Publication Data

US 2020/0195204 A1 Jun. 18, 2020

(51) Int. Cl.
*H03F 3/217* (2006.01)
*H03F 3/00* (2006.01)
*H03F 1/02* (2006.01)
*H03F 1/26* (2006.01)

(52) U.S. Cl.
CPC .......... *H03F 3/005* (2013.01); *H03F 1/0222* (2013.01); *H03F 1/0233* (2013.01); *H03F 1/26* (2013.01); *H03F 3/2171* (2013.01); *H03F 3/2173* (2013.01)

(58) Field of Classification Search
CPC .......... H03F 3/005; H03F 1/26; H03F 1/0222; H03F 1/0233; H03F 3/217; H03F 3/2173; H03F 2200/351; H03F 3/2171
USPC ........................................ 330/10, 207 A, 251
See application file for complete search history.

(56) References Cited

U.S. PATENT DOCUMENTS

| 7,816,982 | B2* | 10/2010 | Wu ........................ H03K 7/08 330/10 |
| 7,893,743 | B2* | 2/2011 | Fenger .................... H03F 3/217 327/172 |
| 8,264,275 | B2* | 9/2012 | Greimel-Rechling ...................... H03F 3/217 330/10 |
| 9,515,617 | B2* | 12/2016 | Hoyerby ................ H03F 3/2173 |
| 9,602,067 | B2* | 3/2017 | Hsieh ..................... H03F 3/217 |
| 9,866,113 | B1 | 1/2018 | Assad et al. |
| 2016/0142018 | A1* | 5/2016 | Williams .............. H01L 27/092 330/251 |

(Continued)

OTHER PUBLICATIONS

Hoyerby, et al. "A 2×70 W Monolithic Five-level Class-D Audio Power Amplifier in 180 nm BCD", Dec. 2016, pp. 2819-2829, IEEE Journal of Solid-State Circuits, vol. , 51., No. 12.

(Continued)

*Primary Examiner* — Khanh V Nguyen
(74) *Attorney, Agent, or Firm* — Armis IP Law, LLC

(57) ABSTRACT

An amplifier comprises: an input stage, a pulse width modulation stage, and a switched output stage. During operation, the input stage receives an input signal (such as an audio signal). The input stage adjusts the input signal based on feedback from the switched output stage of the amplifier. According to one configuration, the feedback from the switched output stage is a voltage across a flying capacitor disposed in the switched output stage. The pulse width modulation stage uses the adjusted input signal or signals to produce respective pulse width modulation signals that are subsequently used to drive (control) switches in the switched output stage. The switches in the switched output stage generate an output voltage to drive a load based on states of the pulse width modulation signals. Adjustments applied to the input signal based on the feedback maintains the magnitude of the flying capacitor voltage at a desired setpoint.

35 Claims, 7 Drawing Sheets

(56) References Cited

U.S. PATENT DOCUMENTS

2018/0205347 A1    7/2018  Das et al.

OTHER PUBLICATIONS

Biswas Suvankar et al: "GaN Based Switched Capacitor Three-Level Buck Converter with Cascaded Synchronous Bootstrap Gate Drive Scheme", 2018 IEEE Energy Conversion Congress and Exposition (ECCE), IEEE, Sep. 23, 2018 (Sep. 23, 2018), pp. 3490-3496, XP033463664.

Extended European Search Report, EP 19215256.9, dated May 8, 2020, pp. 10.

* cited by examiner

FLYING CAPACITOR VOLTAGE CONTROL IN AN AMPLIFIER

BACKGROUND

Conventional audio amplifiers sometimes include a so-called flying capacitor disposed in a respective switched output stage to drive a load. Typically, the flying capacitor stores an intermediate voltage value whose magnitude is a fraction of a magnitude of a main voltage rail powering the switched output stage. Presence of the flying capacitor enables a controller to apply the voltage of the flying capacitor to a load in addition to being able to apply standard voltage rails such as main power source voltage and ground to the load.

As a more specific example, a main voltage rail of a switched output stage of an amplifier may be 5 volts DC; the voltage on the flying capacitor may be set to ½ the main voltage rail or 2.5 volts DC. When present in an amplifier circuit, the so-called flying capacitor is electrically coupled across multiple switches in a switched output stage (such a sequence of series connected switches configured as a bridge circuit).

As is known, the switches in the switched output stage can be independently controlled to produce an output voltage to drive the load. For example, the switches in the output stage can be controlled (switched ON and OFF at appropriate time) to drive the load with a maximum voltage (main voltage rail) or ground reference voltage at different times.

As mentioned, in addition to having an ability to drive a load with a main voltage rail or a ground reference value, presence of one or more the flying capacitors in a respective drive circuit enables the output stage to drive the load with voltages of the one or more flying capacitors at different times. Thus, via activation of different combination of switches in the switched output stage, a respective controller is able to software between driving a load with voltages of different voltage magnitudes such as a main rail voltage, one or more intermediate or fractional voltages (stored in the one or more flying capacitors), and a ground reference voltage to produce an output voltage to power a respective load.

BRIEF DESCRIPTION

Ideally, a voltage stored in a flying capacitor is precisely maintained at a predetermined value. This ensures accurate generation of an output voltage. However, one drawback of the conventional implementation of a flying capacitor in an amplifier circuit is that the voltage across the flying capacitor can drift or vary with respect to a desired setpoint value. In such an instance, undesirable variations in the intermediate voltage stored in the flying capacitor (that is used to drive a respective load) results in unwanted noise or distortion in a generated output signal.

Embodiments herein include novel ways of providing improved performance of an amplifier and generation of an output voltage.

For example, according to one embodiment, an amplifier includes: an input stage, a pulse width modulation stage, and a switched output stage. During operation, the input stage receives an input signal such as an audio signal. The input stage adjusts the input signal based on feedback from the switched output stage. In one embodiment, the feedback is associated with the flying capacitor disposed in the switched output stage. The pulse width modulation stage uses the adjusted input signal or input signals to produce respective pulse width modulation signals that are subsequently used to drive (control) switches in the switched output stage. The switched output stage then generates an output voltage to drive a load (such as an audio speaker) based on states of the pulse width modulation signals. Typically, the output voltage driving the load is an amplified rendition of the input signal.

In one embodiment, the switched output stage includes a sequence of series connected switches (such as one or more bridge-type circuits) to drive the load; the flying capacitor is coupled to the series connected switches. Further, the input stage produces one or more adjusted input signals to control a magnitude of the voltage stored in the flying capacitor. In other words, in one embodiment, generation of the one or more adjusted input signals based on the feedback from the flying capacitor maintains the magnitude of the voltage across the flying capacitor to a desired setpoint voltage. Thus, the input signal being amplified to drive a load can be modified such that the modified input signal also controls a magnitude of voltage on respective one or more flying capacitors.

In still further embodiments, the feedback from the output stage is a magnitude of a voltage of the flying capacitor in the switched output stage. In such an instance, the input stage adjusts the input signal based on a magnitude of the voltage stored in the flying capacitor of the switched output stage. As previously discussed, the adjustments to the input signal maintain the voltage on the flying capacitor at a desired setpoint (such as half, one third, etc.) of a magnitude of a voltage rail powering the output stage.

By further way of nonlimiting example, the flying capacitor stores an intermediate voltage to power the load; the intermediate voltage has a magnitude that is a predetermined percentage or amount of the voltage rail powering the output stage. In one non-limiting example embodiment, a primary voltage rail powering the switched output stage is Pvdd; via the adjusted input signals, the voltage of the flying capacitor is controlled to be ½ Vppd. Note that the desired magnitude of the flying capacitor voltage and setpoint can vary depending on the embodiment.

Note further that the input stage of the amplifier as described herein can be configured to produce a modification value (such as an error voltage itself or gain adjusted error voltage value) based on the received feedback. In such an embodiment, the input stage produces one or more adjusted input signals using the modification value to control a magnitude of a voltage stored in a flying capacitor of the switched output stage.

More specifically, in one embodiment, the input stage can be configured to include: an error voltage generator operable to: i) compare the feedback from the flying capacitor to a desired setpoint voltage, and ii) generate an error voltage signal indicating a difference between the magnitude of the voltage across the flying capacitor and the desired setpoint voltage.

The input stage can further include an adjustor. In one embodiment, the adjustor in the input stage modifies the received input signal based on a magnitude of the generated error voltage signal produced by the error voltage generator. For example, for a first phase of multiple phases, the adjustor in the input stage produces a first adjustment signal based on summing the input signal and the modification value (such as the error voltage or a gain adjusted error voltage); for a second phase of the multiple phases, the adjustor produces a second adjustment signal based on subtracting the modification value from the received input signal.

In one nonlimiting example embodiment, the multiple adjusted input signals (such as the first adjustment signal and the second adjustments signal) represent a complementary signal pair that is generated to control a corresponding first phase and second phase of multiple phases supported in the amplifier to produce the output voltage driving the load.

The adjusted input signals can be analog or digital signals.

Note that the pulse width modulation stage can be a multi-phase pulse width modulation signal generator operable to drive N-phases/switch pairs in the switched output stage. More specifically, in a manner as previously discussed, the input stage is operable to individually derive (produce) a respective adjusted input signal for each of the N-phases of the amplifier using received feedback from one or more flying capacitors present in the switched output stage. In one embodiment, each of the adjusted input signals generated by the input stage controls a corresponding phase or pair of complementary switches in the output stage driving the load.

Embodiments herein are useful over conventional techniques of controlling a flying capacitor voltage. For example, embodiments herein include novel flying capacitor voltage control techniques that result in producing a smoother and less noisy output voltage, making it possible to implement smaller flying capacitors in a respective amplifier application. In one embodiment, as described herein, analog or digital circuitry calculates a deviation of a flying capacitor voltage with respect to an ideal value such as ½ Pvdd (rail voltage to power the amplifier). Further, as previously discussed, an input stage of the amplifier generates an error voltage, which is used as a basis to modify the duty cycles of the individual switch pairs in a multi-level half bridge circuit. Adjustments to the duty cycles control an average flying capacitor current to a desired value.

As further described herein, one embodiment herein includes continuously (or on cycle-by-cycle basis, which is effectively the same) alter PWM (Pulse Width Modulation) duty cycles amongst switch pairs in a half bridge circuit to control a respective flying capacitor voltage in the half bridge circuit. Such embodiments provide a compact and low-noise solution to flying capacitor voltage balancing, ensuring that the best idle power (due to multi-level at low switching frequency) and audio performance (due to minimum flying capacitor balancing noise, even at low switching frequency) are simultaneously achievable.

These and other more specific embodiments are disclosed in more detail below.

Note further that although embodiments as discussed herein are applicable to amplifier circuitry, the concepts disclosed herein may be advantageously applied to any other suitable topologies.

Note that although each of the different features, techniques, configurations, etc., herein may be discussed in different places of this disclosure, it is intended, where appropriate, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section and corresponding figures of the present disclosure as further discussed below.

Figure 1:
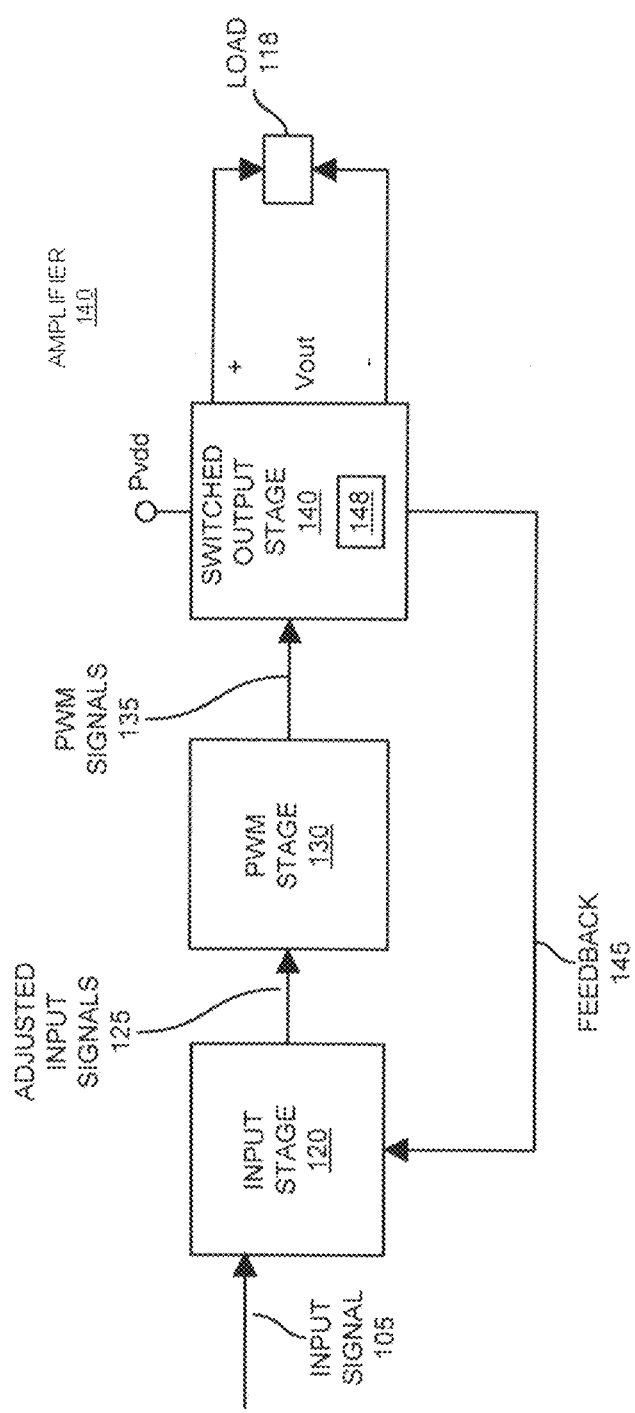
FIG. 1 is an example diagram illustrating components of an amplifier device according to conventional techniques.

The foregoing and other objects, features, and advantages of embodiments herein will be apparent from the following more particular description herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

According to one embodiment, an amplifier includes: an input stage, a pulse width modulation stage, and a switched output stage. The input stage receives an input signal. The input stage adjusts the input signal based on feedback from the switched output stage that drives a load. In one embodiment, the feedback indicates a voltage across a flying capacitor in the switched output stage. The pulse width modulation stage uses the adjusted input signal or signals to produce respective pulse width modulation signals that are subsequently used to drive (control) switches in the switched output stage, resulting in generation of an output voltage to power the load. In one embodiment, the output voltage is a substantial replica of the input signal. Repeated or continuous adjustments (such as cycle after cycle) to the input signal maintain the voltage on the flying capacitor at a desired service provider value (or within a desired voltage range).

FIG. 1 is an example diagram illustrating general components of a multi-stage amplifier device according to conventional techniques.

As shown in this example embodiment, amplifier 140 includes an input stage 120, a pulse width modulation stage 130, and a switched output stage 140.

In one embodiment, the amplifier 100 is a multi-level class D audio power amplifier. However, note that the amplifier 100 can be any suitable type of amplifier depending on the embodiment.

In general, the amplifier 140 produces an output voltage Vout to drive the load 118. The output voltage Vout is substantially an amplified rendition of the input voltage 105.

As shown in FIG. 1, the input stage 120 of the amplifier 100 receives an input signal 105. The input signal 105 can be received from any suitable resource such as an audio file, microphone, etc.

In furtherance of producing the output voltage, Vout, the input stage 120 adjusts the input signal 105 based on feedback 145 received from the switched output stage 140.

In one embodiment, the switched output stage 140 includes a flying capacitor 148. The feedback 145 is based on a voltage stored in the flying capacitor 148 disposed in the switched output stage 140.

The pulse width modulation stage 130 uses the adjusted input signal 125 (or signals) to produce respective pulse width modulation signals 135 that are subsequently used to drive (control) switches in the switched output stage 140. The switched output stage 140 generates an output voltage, Vout, to drive the load 118 (such as an audio speaker) based on states of the pulse width modulation signals 135.

In one embodiment, the input stage 120 produces the adjusted input signals 125 to control a magnitude of the voltage stored in the flying capacitor 148. In other words, modification of the received input signal 105 to adjusted input signals 125 based on the feedback 145 maintains the magnitude of the voltage across the flying capacitor 148 to a desired setpoint voltage or maintain the voltage within a desired voltage range. As further discussed below, the switched output stage 140 utilizes voltage sources such as the input voltage, Pvdd, the voltage on the flying capacitor 148, and ground reference voltage to generate the output voltage, Vout.

Accordingly, in contrast to conventional techniques, the adjusted input signals 125 as described herein provide control of a voltage in the flying capacitor 148 as well as provides a basis to generate Vout (such as an amplified rendition of the input signal 105) to drive the load 118.

Figure 2:
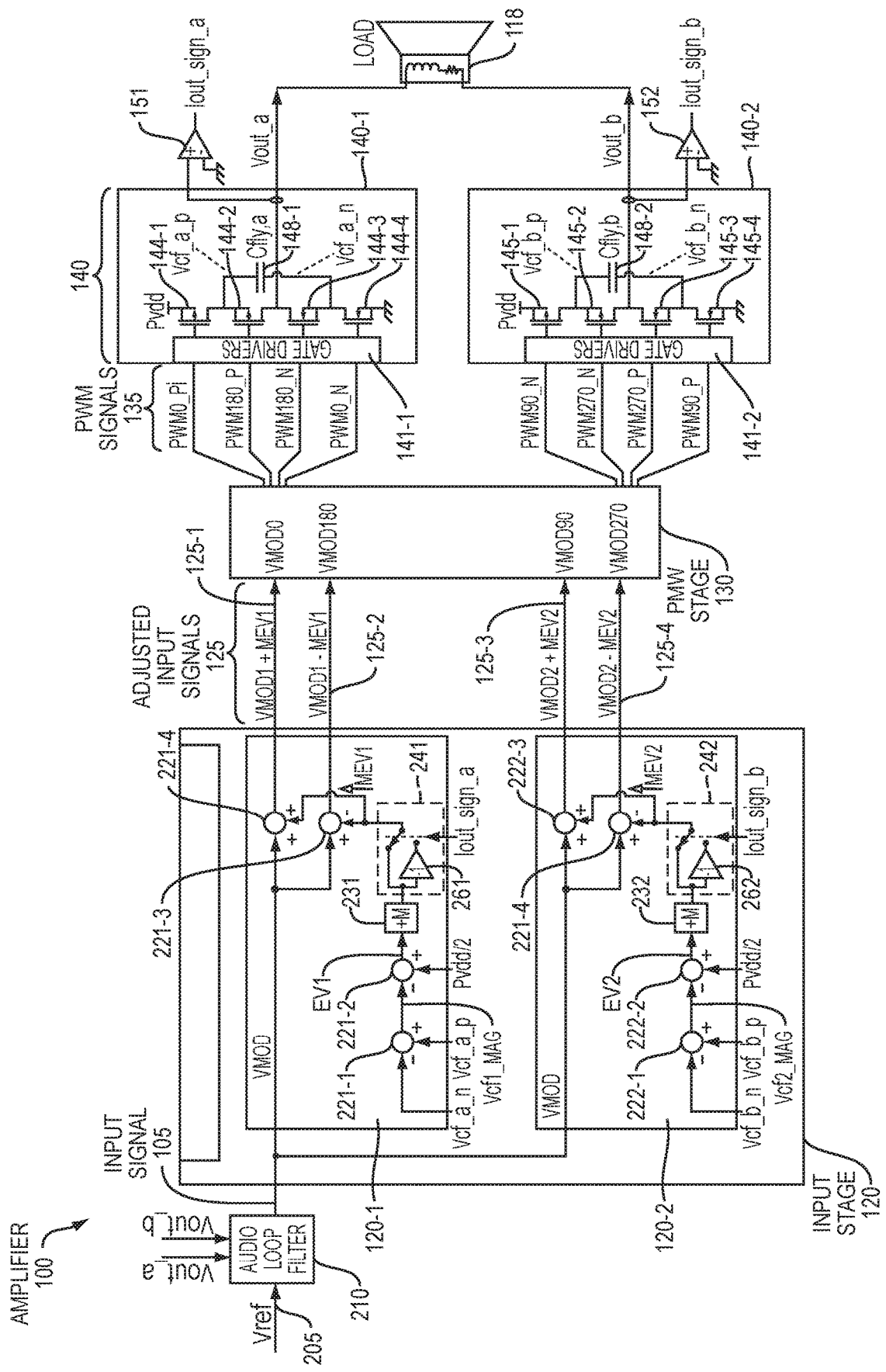
FIG. 2 is a more detailed example diagram illustrating implementation of an amplifier device according to embodiments herein.

FIG. 2 is a more detailed example diagram illustrating implementation of a multi-stage amplifier device according to embodiments herein.

As shown in FIG. 2, the amplifier 100 includes audio loop filter 210, input stage 120, pulse width modulation stage 130, switched output stage 140, and load 118.

As further shown, the input stage 120 (such as implemented via analog circuitry, digital circuitry, or a combination of both analog and digital circuitry) includes input stage 120-1 and input stage 120-2.

Input stage 120-1 includes summer 221-1, summer 221-2, gain stage 231, controllable polarity changer 241, gain stage 261 (such as "multiply by −1" amplifier (analog inverter, which is part of the controllable polarity changer 241), summer 221-3, and summer 221-4.

Input stage 120-2 includes summer 222-1, summer 222-2, gain stage 232, controllable polarity changer 242, gain stage 262 (such as "multiply by −1" amplifier (analog inverter, which is part of controllable polarity changer 242), summer 222-3, and summer 222-4.

Figure 3:
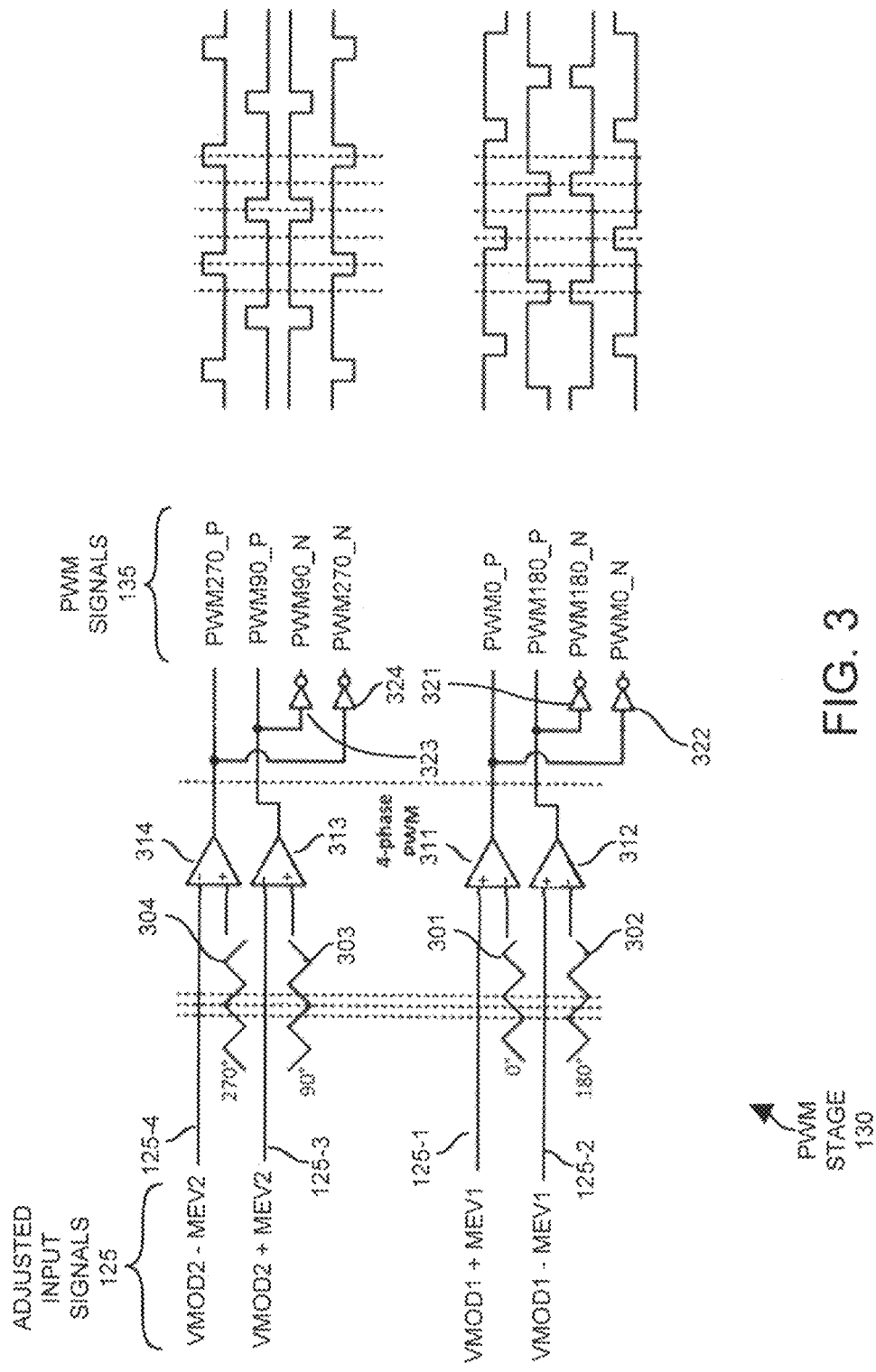
FIG. 3 is an example diagram illustrating details of a pulse width modulation stage according to embodiments herein.

Pulse width modulation stage 130 includes components as further shown and discussed in FIG. 3.

Referring again to FIG. 2, the switched output stage 140 includes switched output stage 140-1 (such as a first half bridge or other suitable type of switching circuit) and switched output stage 140-2 (a second half bridge or other suitable type of switching circuit).

Switched output stage 140-1 includes gate drivers 141-1, switch 144-1, switch 144-2, switch 144-3, switch 144-4, flying capacitor 148-1, and comparator 151.

In one embodiment, the comparator 151 is an output stage current polarity detector. As shown, comparator 151 senses a representation of the instantaneous output current from source voltage Vout_a.

Switched output stage 140-2 includes gate drivers 141-2, switch 145-1, switch 145-2, switch 145-3, switch 145-4, flying capacitor 148-2, and comparator 152.

In one embodiment, the comparator 152 is an output stage current polarity detector. As shown, comparator 152 senses a representation of the instantaneous output current from source voltage Vout_b.

During operation, the audio loop filter 210 receives the input signal 205 and produces respective input signal 105 received by the input stage 120. In one embodiment, the input signal 205 is an analog audio signal being amplified.

The audio loop filter 210 can be configured to control generation of producing the input signal 105 (from input signal 205) based upon feedback such as Vout_a and Vout_b produced by the switched output stage 140.

In one non-limiting example embodiment, the input signal 105 is a quasi-sinusoidal analog signal offset by 750 m VDC; a magnitude of the input signal 105 varies between 0 and 1.5 VDC. However, note that the magnitude of the input signal 105 can vary within any suitable voltage range depending on the application.

In one embodiment, a frequency of the input signal 105 is near DC, such as between 10 Hz and 10 KHz, although the frequency can vary within any suitable range depending on the application.

As further shown, input stage 120-1 uses the input signal 105 (a.k.a., VMOD) to generate adjusted input signals 125-1 and 125-2 for phases 0 and 180.

Input stage 120-1 includes an error voltage generator (such as a combination of summer 221-1 and 221-2) that compares the feedback (such as differential voltage Vcf_a_p and Vcf_a_n) from the flying capacitor 148-1 to a desired setpoint voltage of ½ Pvdd, and generates an error voltage signal EV1 indicating a difference between the magnitude of the voltage across the flying capacitor 148-1 and the desired setpoint voltage ½ Pvdd.

Note again that a setting of ½ Pvdd is by way of non-limiting example embodiment; the setpoint can be any suitable value.

More specifically, via a feedback path from the switched output stage 140 to the input stage 120, the summer 221-1 of the input stage 120-1 receives the differential voltage (Vcf_a_p and Vcf_a_n) across the flying capacitor 148-1.

The summer 221-1 subtracts Vcf_a_n from Vcf_a_p to produce a difference signal Vcf1_mag (representing a magnitude of voltage across the flying capacitor 148-1).

As further shown, summer 221-2 subtracts the signal Vcf1_mag (voltage across the flying capacitor 148-1) from the desired setpoint voltage value ½ Pvdd to produce the error voltage, EV1. A magnitude of the error voltage, EV1, indicates an amount in which the magnitude of the voltage across the flying capacitor 148-1 is different than a desired setpoint Pvdd/2.

Gain stage 231 of input stage 120 receives the error voltage EV1 outputted from the summer 221-2. Gain stage 231 applies gain (such as gain of +M) to the error voltage EV1 and inputs +M multiplied by EV1 (such as a modification value) to the controllable polarity changer 241. In a manner as previously discussed, a magnitude of the modification value +M EV1 varies depending on a voltage across the flying capacitor 148-1.

Comparator 151 compares a magnitude of the voltage Vout_a (fed into the non-inverting input of comparator 151) to a reference value such as ground (fed into the inverting input of comparator 151) to produce control signal Iout_sign_a.

Based on control signal Iout_sign_a, controllable polarity changer 241 switches between inputting the gain adjusted voltage +M EV1 (+M time EV1) or −M EV1 (−M time EV1, through −1 gain stage 261 in controllable polarity changer 241) to summer 221-3 and summer 221-4. Thus, via control signal Iout_sign_a received from switched output stage 140-1, the output of the comparator 151 (of the switched output stage 140-2) controls whether to set the output voltage MEV1 to +M EV1 or −M EV1.

As further shown, the summer 221-4 (such as an adjustor) receives the input signal 105 (VMOD) and adds MEV1 (which equals +MEV1 or −MEV1 depending on a state of Iout_sign_a inputted to controllable polarity changer 241) to it. In this example embodiment, the summer 221-4 outputs the adjusted input signal 125-1 (such as VMOD+MEV1) to the pulse width modulation stage 130.

Embodiments herein include sensing the output current polarity with comparator 151, and use of the sensed information to flip the feedback system polarity using controllable polarity changer 241. This is because the polarity of the output current determines the relationship between MEV1 and the flycap voltage. Note that if the current polarity is incorrect, then there would exist positive feedback in the control loop (which means that the flying capacitor voltage would become unstable) instead of negative feedback (which stabilizes the flycap voltage.)

The summer 221-3 also receives the input signal 105 (VMOD) and subtracts MEV1 (which equals +MEV1 or −MEV1 depending on a state of Iout_sign_a) from it to produce signal 125-2. The summer 221-4 outputs the signal 125-2 (such as VMOD−MEV1) to the pulse width modulation stage 130 as well.

In a similar manner, the input stage 120-2 produces adjusted input signals 125-3 and 125-4 for different phases (such as phase 90 and 270).

For example, input stage 120-2 includes an error voltage generator (such as combination of summer 222-1 and 222-2) that compares the feedback (Vcf_b_p and Vcf_b_n) from the flying capacitor 148-2 to a desired setpoint voltage of ½ Pvdd, and generates an error voltage signal EV2 indicating a difference between the magnitude of the voltage across the flying capacitor 148-2 and the desired setpoint voltage ½ Pvdd.

More specifically, as shown, the summer 222-1 of the input stage 120-2 receives the differential voltage (Vcf_b_p and Vcf_b_n) across the flying capacitor 148-2.

The summer 221-1 subtracts Vcf_b_n from Vcf_b_p to produce a difference signal Vcf2_mag (representing a magnitude of voltage across the flying capacitor 148-2).

As further shown, summer 222-2 subtracts the signal Vcf2_mag (voltage across the flying capacitor 148-2) from the desired setpoint voltage value Pvdd/2 to produce the error voltage, EV2. A magnitude of the error voltage, EV2, indicates a degree to which the magnitude of the voltage across the flying capacitor 148-2 is different than a desired setpoint Pvdd/2.

Gain stage 232 receives the error voltage EV2 outputted from the summer 222-2. Gain stage 232 applies gain (such as gain of +M) to the error voltage EV2 and inputs +M multiplied by EV2 (such as a modification value) to the controllable polarity changer 242. A magnitude of the modification value +M multiplied by EV varies depending on a voltage across the flying capacitor 148-2.

Comparator 152 compares a magnitude of the voltage Vout_b (fed into the non-inverting input of comparator 152) to a reference value such as ground (fed into the inverting input of comparator 152) to produce control signal Iout_sign_a.

Based on control signal Iout_sign_b, controllable polarity changer 242 switches between inputting the gain adjusted voltage +M multiplied by EV2 or −M multiplied by EV2 (such as through −1 gain stage 262 in controllable polarity changer 242) to summer 222-3 and summer 222-4.

Thus, via control signal Iout_sign_b, the output of the comparator 152 (of the switched output stage 140-2) controls whether to set the output voltage MEV2 to +M multiplied by EV2 or −M multiplied by EV2.

As further shown, the summer 222-3 (such as an adjustor) receives the input signal 105 (VMOD) and adds M multiplied by EV2 (which equals +MEV2 or −MEV2 depending on a state of Iout_sign_b inputted to controllable polarity changer 242) to it. The summer 222-3 outputs the adjusted input signal 125-3 (such as VMOD+MEV2) to the pulse width modulation stage 130.

Embodiments herein include sensing the output current polarity with comparator 152, and use of the sensed information to flip the feedback system polarity using controllable polarity changer 242. This is because the polarity of the output current determines the relationship between MEV2 and the flying capacitor voltage. Note that if the current polarity is incorrect, then there would exist positive feedback in the control loop (which means that the flying capacitor voltage would become unstable) instead of negative feedback (which stabilizes the flying capacitor voltage.)

The summer 222-4 receives the input signal 105 (VMOD) and subtracts MEV2 (which equals +M multiplied by EV2 or −M multiplied by EV2 depending on a state of Iout_sign_b) from it to produce signal 125-4.

The summer 222-4 outputs the signal 125-4 (such as VMOD−MEV4) to the pulse width modulation stage 130 as well.

Accordingly, the input stage 120 modifies the input signal 105 (VMOD) depending on a magnitude of respective voltage stored on flying capacitor 148-1 and flying capacitor 148-2.

FIG. 3 is an example diagram illustrating details of a pulse width modulation stage according to embodiments herein.

As shown in this example embodiment, the pulse width modulation stage 130 includes comparator 311, comparator 312, comparator 313, comparator 314, inverter 321, inverter 322, inverter 323, and inverter 324.

As shown, non-inverting input (+) of the comparator 311 receives adjusted input signal 125-1 (VMOD+MEV1) generated by the input stage 120. The inverting input (−) of comparator 311 receives the sawtooth (or triangular) reference signal 301. In one embodiment, a magnitude of the adjusted input signal 125-1 (which varies) falls within a voltage amplitude range of the sawtooth reference signal 301 (which can be any suitable range such as between 0 and 1.5 VDC). Typically, a frequency of the sawtooth reference signal 301 is between 100 kHz and 1 MHz, although the frequency can be any suitable value.

In this example embodiment, the comparator 311 produces a logic hi output when the magnitude of the input signal 125-1 (such as VMOD+MEV1) is greater than the magnitude of the sawtooth reference signal 301. The comparator 311 produces a logic lo output when the magnitude of the input signal 125-1 (such as VMOD+MEV1) is less than the magnitude of the sawtooth reference signal 301.

In this example embodiment, based on comparison of adjusted input signal 125-1 (VMOD+MEV1) to the sawtooth reference signal 301, the comparator 311 produces the pulse width modulation signal PWM0_P.

Inverter 321 receives pulse width modulation signal PWM0_P and produces corresponding pulse width modulation signal PWM0_N, which is an inversion of the pulse width modulation signal PWM0_P.

As further shown, non-inverting input (+) of the comparator 312 receives adjusted input signal 125-2 (VMOD−MEV1) generated by the input stage 120. The inverting input (−) of comparator 312 receives sawtooth reference signal 302 (180 degrees apart from sawtooth reference signal 301). Typically, a frequency of the sawtooth reference signal 302 is between 100 kHz and 1 MHz, although the frequency can be any suitable value.

The comparator 312 produces a logic hi output when the magnitude of the input signal 125-2 (VMOD−MEV1) is greater than the magnitude of the sawtooth reference signal 302. The comparator 312 produces a logic lo output when the magnitude of the input signal 125-2 (VMOD−MEV1) is less than the magnitude of the sawtooth reference signal 302.

Further in this example embodiment, based on comparison of adjusted input signal 125-2 (VMOD−MEV1) to the sawtooth reference signal 302, the comparator 312 produces the pulse width modulation signal PWM180_P.

Inverter 322 receives pulse width modulation signal PWM180_P and produces corresponding pulse width modulation signal PWM180_N, which is an inversion of the pulse width modulation signal PWM180_P.

As further shown, inverting input (−) of the comparator 313 receives adjusted input signal 125-3 (VMOD+MEV2) generated by the input stage 120. The non-inverting input (+) of comparator 313 receives sawtooth reference signal 303 (90 degrees apart from sawtooth reference signal 301). Typically, a frequency of the sawtooth reference signal 301 is between 100 kHz and 1 MHz, although the frequency can be any suitable value.

The comparator 313 produces a logic lo output when the magnitude of the input signal 125-3 (VMOD+MEV2) is greater than the magnitude of the sawtooth reference signal 303.

The comparator 313 produces a logic hi output when the magnitude of the input signal 125-3 (VMOD+MEV2) is less than the magnitude of the sawtooth reference signal 303.

Based on comparison of adjusted input signal 125-3 (VMOD+MEV2) to the sawtooth reference signal 303, the comparator 313 produces the pulse width modulation signal PWM90_P.

Inverter 323 receives pulse width modulation signal PWM90_P and produces corresponding pulse width modulation signal PWM90_N, which is an inversion of the pulse width modulation signal PWM90_P.

As further shown, inverting input (−) of the comparator 314 receives adjusted input signal 125-4 (VMOD−MEV2) generated by the input stage 120. The non-inverting input (+) of comparator 314 receives sawtooth reference signal 304 (270 degrees apart from sawtooth reference signal 301). Typically, a frequency of the sawtooth reference signal 301 is between 100 kHz and 1 MHz, although the frequency can be any suitable value.

The comparator 314 produces a logic lo output when the magnitude of the input signal 125-4 (VMOD−MEV2) is greater than the magnitude of the sawtooth reference signal 304. The comparator 314 produces a logic hi output when the magnitude of the input signal 125-4 (VMOD−MEV2) is less than the magnitude of the sawtooth reference signal 304.

Further in this example embodiment, based on comparison of adjusted input signal 125-4 (VMOD−MEV2) to the sawtooth reference signal 304, the comparator 314 produces the pulse width modulation signal PWM270_N.

Inverter 324 receives pulse width modulation signal PWM270_P and produces corresponding pulse width modulation signal PWM270_N, which is an inversion of the pulse width modulation signal PWM270_P.

In one embodiment, a frequency ($f_{sw}$) of the pulse width modulation signals is between 100 and 200 KHz, although the frequency can be any suitable value.

Referring again to FIG. 2, the switched output stage 140-1 includes a sequence of series connected switches (such as one or more half bridge-type circuits including respective switches) to drive Vout_a or Vout_b to the load 118. The pulse width modulation control signals as previously discussed control states of the switches 144.

In a manner as shown, the flying capacitor 148-1 is coupled to the series connected switches 144 in switched output stage 140-1; flying capacitor 148-2 is coupled to switches 145 in the switched output stage 140-2.

As previously discussed, the input stage 120 produces one or more adjusted input signals 125 to control a magnitude of the voltage stored in the flying capacitors 148. In other words, in one embodiment, modification of the received input signal 105 based on the feedback of the voltage of the flying capacitors 148 and generation of the adjusted input signals 125 maintains the magnitude of the voltage across each of the flying capacitors 148-1 and 148-2 to a desired setpoint voltage (such as ½ Pvdd).

Thus, the input signal 105 being amplified can be modified such that the modified input signals 125 control a magnitude of voltage on the flying capacitors 148 as well as control switches to produce the output voltage Vout_a and Vout_b (replica of input signal 105).

Note that a logic hi voltage of a respective pulse width modulation signal activates a respective switch while a logic low deactivates a respective switch.

As shown, through a respective gate driver 141-1, the pulse width modulation signal PWM0_P drives the gate of switch 144-1 (such as a field effect transistor or other suitable switch component) to control activation of switch 144-1; the pulse width modulation signal PWM180_P drives the gate of switch 144-2 (such as a field effect transistor or other suitable switch component) to control activation of switch 144-2; the pulse width modulation signal PWM180_N drives the gate of switch 144-3 (such as a field effect transistor or other suitable switch component) to control activation of switch 144-3; the pulse width modulation signal PWM0_N drives the gate of switch 144-4 (such as a field effect transistor or other suitable switch component) to control activation of switch 144-4.

As further shown, through a respective gate driver 141-2, the pulse width modulation signal PWM90_N drives the gate of switch 145-1 (such as a field effect transistor or other suitable switch component) to control activation of switch 145-1; the pulse width modulation signal PWM270_N drives the gate of switch 145-2 (such as a field effect transistor or other suitable switch component) to control activation of switch 145-2; the pulse width modulation signal PWM270_P drives the gate of switch 145-3 (such as a field effect transistor or other suitable switch component) to control activation of switch 145-3; the pulse width modulation signal PWM90_P drives the gate of switch 145-4 (such as a field effect transistor or other suitable switch component) to control activation of switch 145-4.

Thus, in summary, the input stage 120 receives an input signal 105 such as an audio signal. The input stage 120 applies adjustments to the input signal 105 based on feedback (such as Vcf_a_p and Vcf_a_n from flying capacitor 148-1 and Vcf_b_p and Vcf_b_n from flying capacitor 148-2) from the switched output stage 140. The pulse width modulation stage 130 uses the adjusted input signals 125 to produce respective pulse width modulation signals 135 that are subsequently used to drive (control) switches 144 and 145) in the switched output stage 140. The switched output stage 140 generates an output voltage Vout_a and Vout_b to drive a load 119 (such as an audio speaker, modeled as an inductor, or voice coil, in series with and resistor) based on states of the pulse width modulation signals 135. In one embodiment, the output voltage Vout is an amplified rendition of the input signal 105.

As previously discussed, embodiments herein are useful over conventional techniques of implementing and controlling a flying capacitor voltage. For example, the novel flying capacitor voltage control techniques as described herein provide smoother and less noisy operation of an amplifier 100, making it possible to implement smaller flying capacitors in amplifier 100. In one embodiment, as described herein, analog or digital circuitry calculates a deviation of a flying capacitor voltage an ideal value such as ½ Pvdd (rail voltage to power the amplifier and switched output stage 140). As previously discussed, an input stage 120 generates an error voltage (such as EV1 and/or EV2) to modify the duty cycles of the individual switch pairs in a multi-level half bridge circuit to control an average flying capacitor current.

As further described herein, one embodiment herein includes continuously (or on cycle-by-cycle basis, which is effectively the same) alter PWM (Pulse Width Modulation) duty cycles between switch pairs in a flying capacitor half bridge circuit to control the flying capacitor voltage. Such embodiments provide a compact and low-noise solution to flying capacitor voltage balancing, ensuring that the best idle power (due to multi-level at low switching frequency) and audio performance (due to minimum flying capacitor balancing noise, even at low switching frequency) are simultaneously achievable.

In this example embodiment, the amplifier 100 supports four phases (namely, phases 0, 90, 180, and 270). Note that the amplifier 100 as described herein can be configured to support any number of N phases via suitable circuitry.

Figure 4:
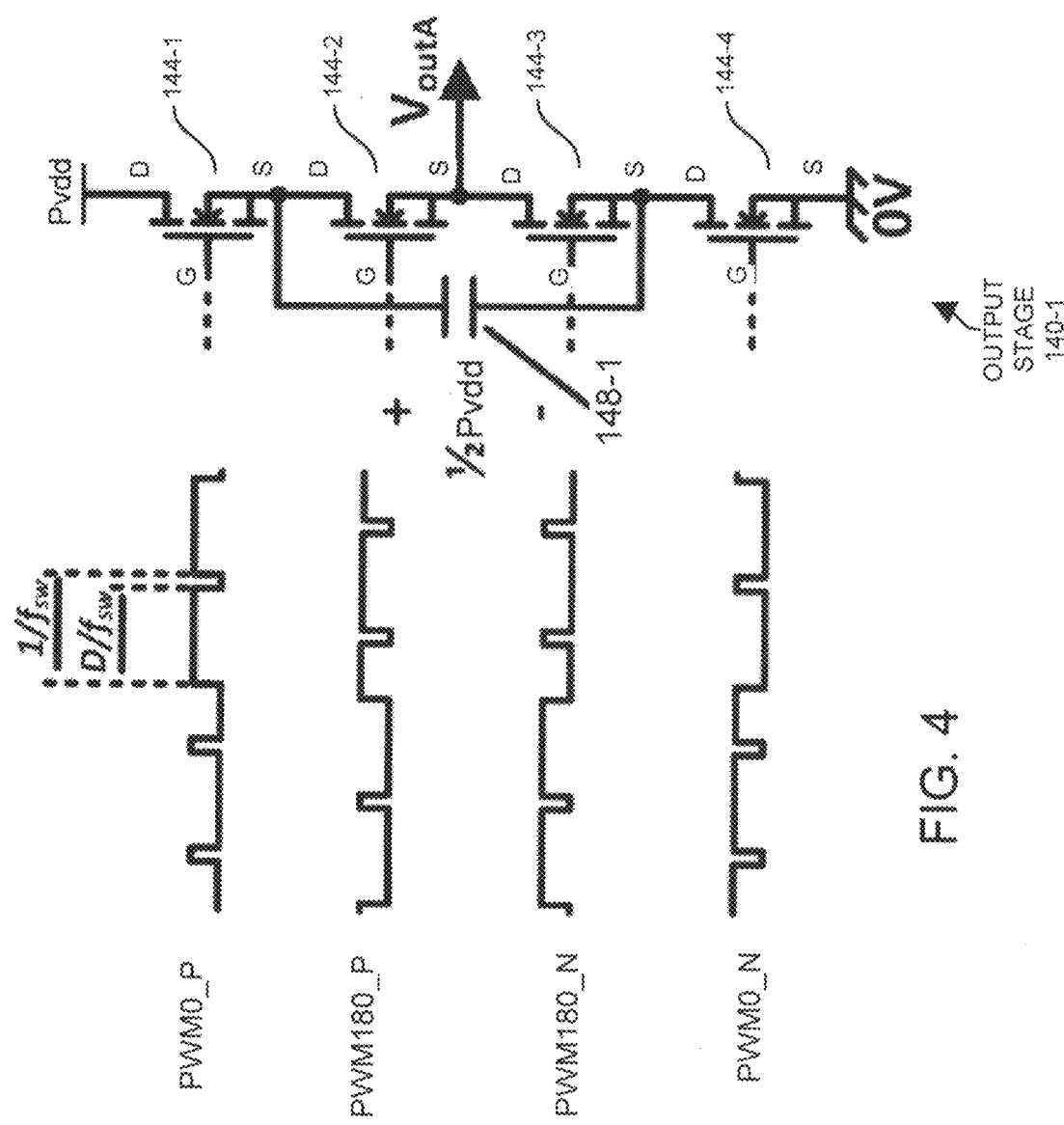
FIG. 4 is an example diagram illustrating control and operation of a switched output stage according to embodiments herein.

FIG. 4 is an example diagram illustrating control and operation of a switched output stage according to embodiments herein.

In this example embodiment, the switched output stage 140-1 includes switch 144-1, switch 144-2, switch 144-3, and switch 144-4.

Note that a logic hi applied to a respective gate of a switch controls a state of the respective switch to an ON state (low resistance path); a logic lo applied to a respective gate of a switch controls a state of the respective switch to an OFF state (high resistance path).

As further shown, the pulse width modulation signal PWM0_P controls switch 144-1; the pulse width modulation signal PWM0_N controls switch 144-4.

The pulse width modulation signal PWM180_P controls switch 144-2; the pulse width modulation signal PWM180_N controls switch 144-3.

The switched output stage 140-2 and corresponding switches are controlled in a similar manner. For example, as shown in FIG. 2, pulse width modulation signal PWM90_N controls switch 145-1; the pulse width modulation signal PWM90_P controls switch 145-4.

The pulse width modulation signal PWM270_N controls switch 145-2; the pulse width modulation signal PWM270_P controls switch 145-3.

Figure 5:
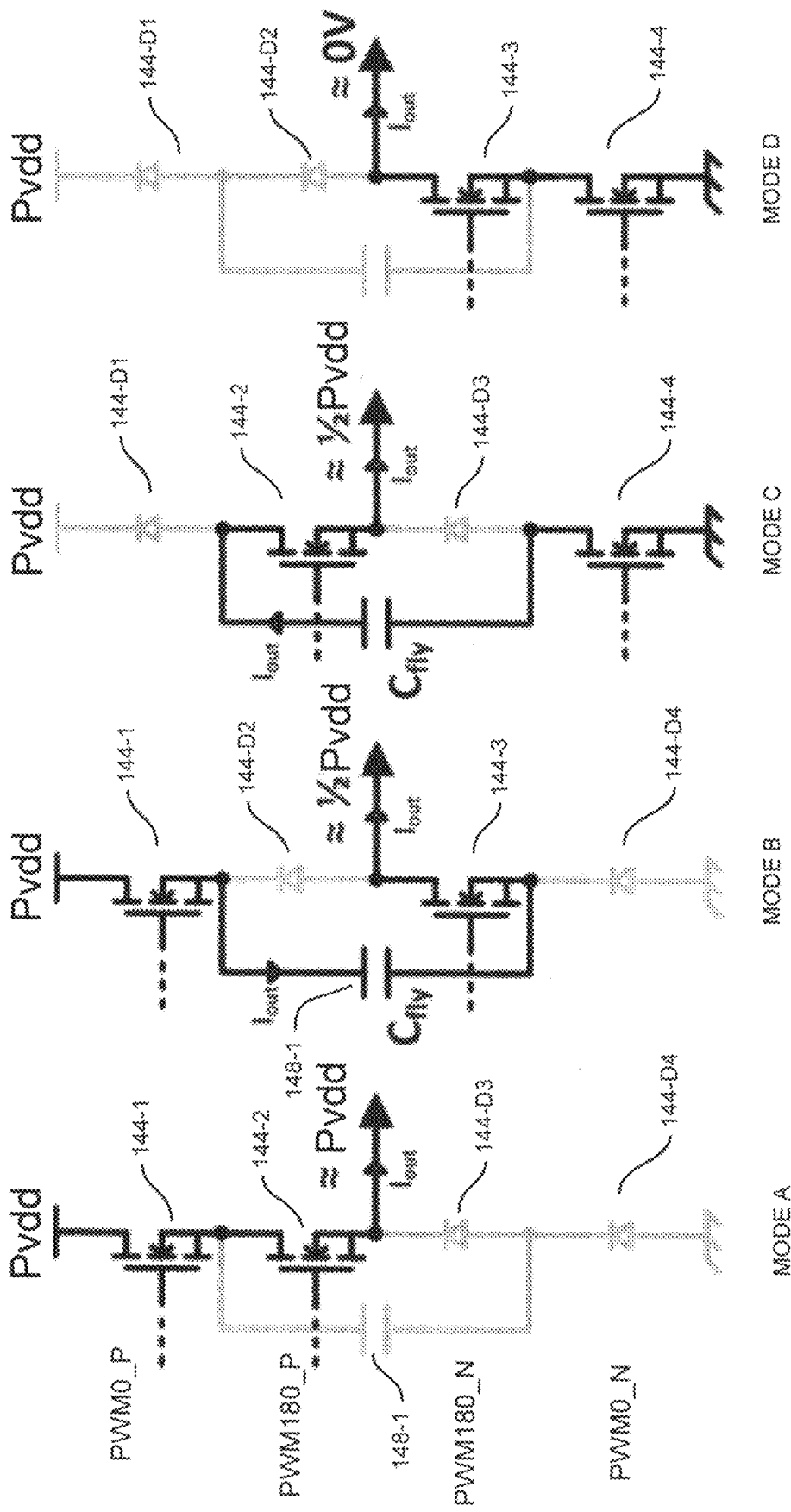
FIG. 5 is an example diagram illustrating different operational modes of a switched output stage according to embodiments herein.

FIG. 5 is an example diagram illustrating different operational modes of a switched output stage according to embodiments herein.

As shown in FIG. 5, the different possible modes in which to control the switches 144-1, 144-2, 144-3, and 144-4 includes mode A, mode B, mode C, and mode D.

As previously discussed, flying capacitor 148-1 stores a voltage ½ Pvdd. Accordingly, the switched output stage 140 can be configured to output voltages Pvdd, ½ Pvdd, or 0 VDC depending on a state of the respective switches 144-1, 144-2, 144-3, and 144-4.

During mode A in this example embodiment: the pulse width modulation signal PWM0_P drives the gate of switch 144-1 such that switch 144-1 is ON; the pulse width modulation signal PWM180_P drives the gate of switch 144-2 such that switch 144-2 is ON; the pulse width modulation signal PWM180_N drives the gate of switch 144-3 such that switch 144-3 is OFF, the switch 140-3 effectively becomes inherent diode 140-D3; the pulse width modulation signal PWM0_N drives the gate of switch 144-4 such that switch 144-4 is OFF, the switch 144-4 effectively becomes inherent diode 144-D4.

In such an instance, during mode A, the output voltage Vouta is approximately equal to voltage Pvdd.

During mode B: the pulse width modulation signal PWM0_P drives the gate of switch 144-1 such that switch 144-1 is ON; the pulse width modulation signal PWM180_P drives the gate of switch 144-2 such that switch 144-2 is OFF, the switch 144-2 effectively becomes inherent diode 140-D2; the pulse width modulation signal PWM180_N drives the gate of switch 144-3 such that switch 144-3 is ON; the pulse width modulation signal PWM0_N drives the gate of switch 144-4 such that switch 144-4 is OFF, the switch 144-4 effectively becomes inherent diode 144-D4.

In such an instance, during mode B, the output voltage Vouta from the switched output stage 140-1 is approximately equal to voltage ½ Pvdd.

During mode C: the pulse width modulation signal PWM0_P drives the gate of switch 144-1 such that switch 144-1 is OFF, the switch 144-1 effectively becomes inherent diode 144-D1; the pulse width modulation signal PWM180_P drives the gate of switch 144-2 such that switch 144-2 is ON; the pulse width modulation signal PWM180_N drives the gate of switch 144-3 such that switch 144-3 is OFF, the switch 144-3 effectively becomes inherent diode 144-D3; the pulse width modulation signal PWM0_N drives the gate of switch 144-4 such that switch 144-4 is ON.

In such an instance, during mode C, the output voltage Vouta is approximately equal to voltage ½ Pvdd.

During mode D: the pulse width modulation signal PWM0_P drives the gate of switch 144-1 such that switch 140-1 is OFF, the switch 144-1 effectively becomes inherent diode 144-D1; the pulse width modulation signal PWM180_P drives the gate of switch 144-2 such that switch 144-2 is OFF, the switch 144-2 effectively becomes inherent diode 144-D2; the pulse width modulation signal PWM180_N drives the gate of switch 144-3 such that switch 144-3 is ON; the pulse width modulation signal PWM0_N drives the gate of switch 144-4 such that switch 144-4 is ON.

In such an instance, during mode D, the output voltage Vouta is approximately equal to voltage 0 VDC.

The pulse width modulation stage 130 controls group of switches 145 in the switched output stage 140-2 in a similar manner based on 90 and 270 phase pulse width modulation control signals to output different voltage levels associated with voltage Voutb.

Figure 6:
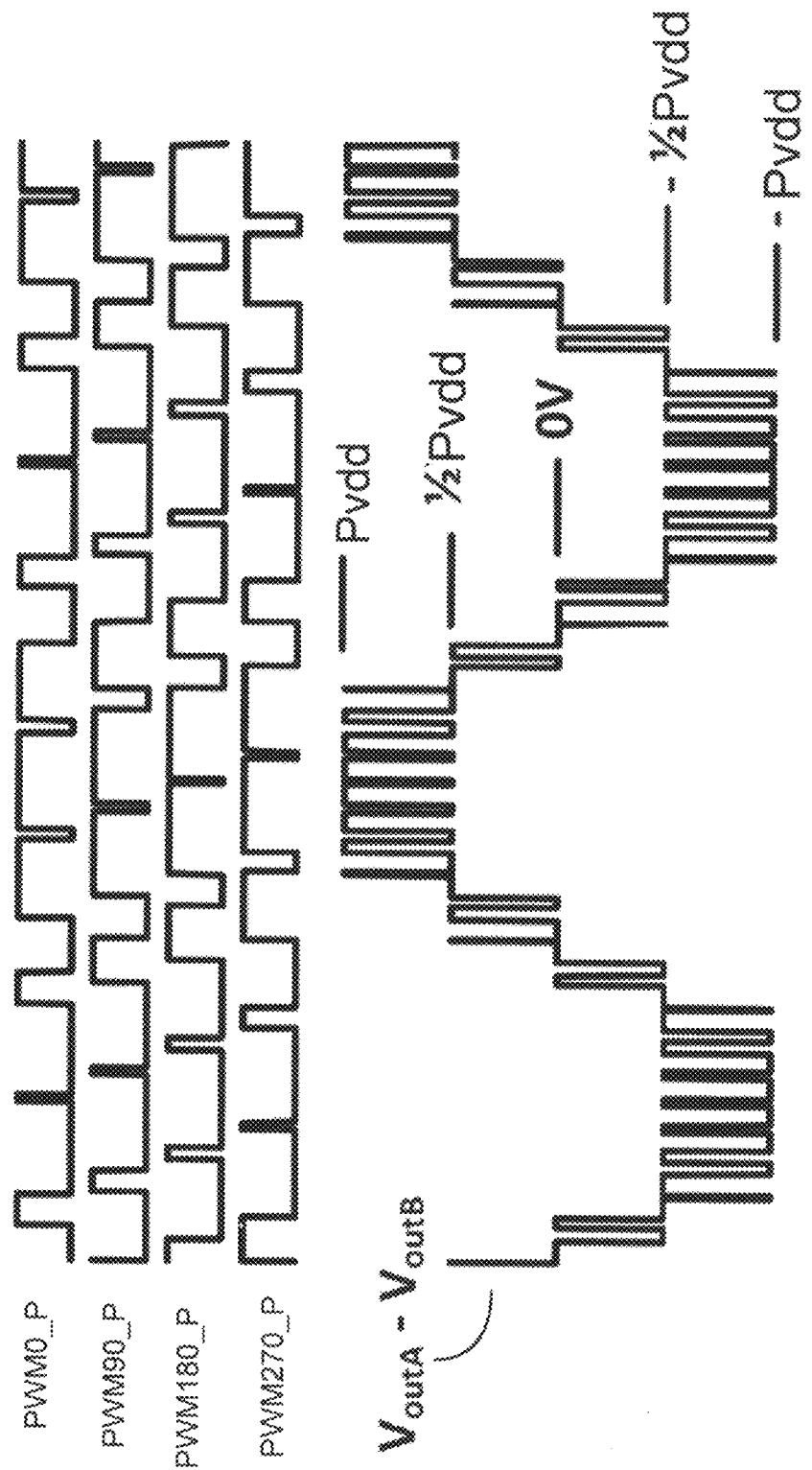
FIG. 6 is an example diagram illustrating generation of a modulated output signal according to embodiments herein.

FIG. 6 is an example diagram illustrating generation of a modulated output signal according to embodiments herein.

In this example embodiment, the pulse width modulation stage 130 drives the switched output stage 140 using pulse width modulation signals as previously discussed. The voltage across the load 118 is Vouta−Voutb (differential signal or modulated signal).

In one embodiment, the load 118 includes a filter (such as a series connected resistor and inductor) to smooth the modulated signal Vouta−Voutb into an amplified replica of the input signal 105 (such as a sine-wave, quasi-sine wave, variable voltage signal, etc.).

Functionality supported by the different resources will now be discussed via flowchart in FIG. 7. Note that the steps in the flowcharts below can be executed in any suitable order.

Figure 7:
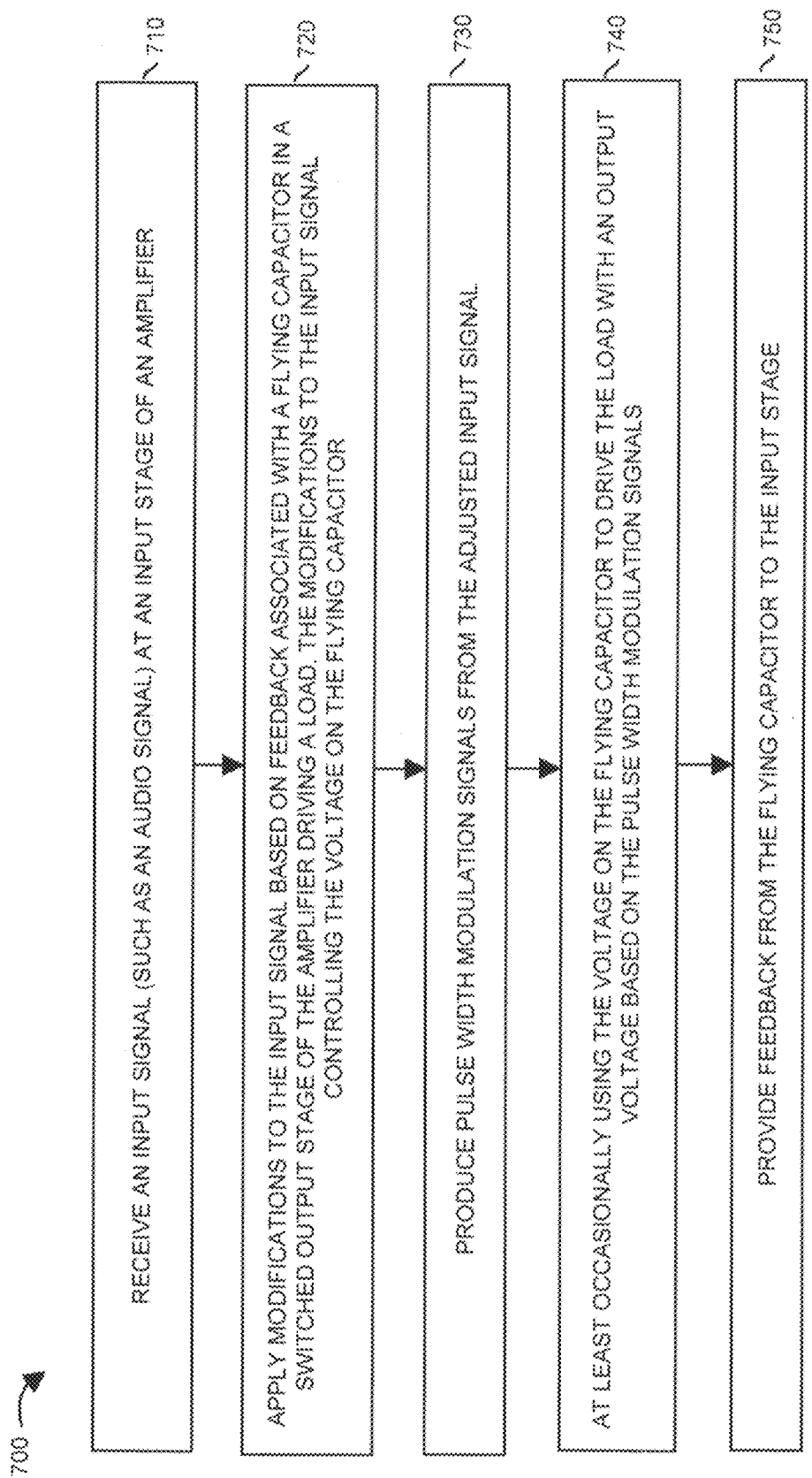
FIG. 7 is an example diagram illustrating a method of providing signal generation according to embodiments herein.

FIG. 7 is a flowchart 700 illustrating an example method according to embodiments herein. Note that there will be some overlap with respect to concepts as discussed above.

In processing operation 710, the input stage 120 receives an input signal 105 (such as an audio signal) to be played back over a load 118 such as a speaker.

In processing operation 720, the input stage 120 applies modifications (based on error voltage, EVX) to the input signal 105 based on feedback 145 associated with a flying capacitor 148, namely Cfly, in the switched output stage 140 of the amplifier 100 driving load 118. The modifications to the input signal 105 control the magnitude of the voltage on the flying capacitor 148, Cfly.

In processing operation 730, the pulse width modulation stage 130 produces pulse width modulation signals 135 from the adjusted input signals 125.

In processing operation 740, in accordance with states of the pulse width modulation signals 135, the switched output stage 140 at least occasionally uses the voltage on the flying capacitor 148 (Cfly) to drive the load 118 with an output voltage (such as Vout_a).

In processing operation 750, the switched output stage 140 provides feedback 145 from the flying capacitor 148 (Cfly) to the input stage 120.

Note again that techniques herein are well suited for use in amplifier devices. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

The invention claimed is:

1. An amplifier comprising:
    an input stage to receive an input signal, the input stage operable to adjust the input signal based on feedback from a switched output stage of the amplifier, the feedback indicating a voltage stored by a flying, capacitor in the switched output stage;
    a pulse width modulation stage operable to produce pulse width modulation signals from the adjusted input signal;
    the switched output stage operable to generate an output voltage to power a load based on the pulse width modulation signals, the switched output stage generating the feedback used by the input stage to adjust the input signal; and
    the amplifier further comprising: an error voltage generator operable to generate an error voltage signal indicating a difference between the voltage stored in the flying capacitor and a desired setpoint voltage, the input stage operable to adjust the input signal based on the error voltage signal.

2. The amplifier as in claim 1, wherein the input stage is operable to adjust the input signal depending upon a magnitude of the voltage stored by the flying capacitor.

3. The amplifier as in claim 2, wherein the voltage stored by the flying capacitor is an intermediate voltage that drives current to the load, the intermediate voltage having a magnitude that is a predetermined fraction of a magnitude of a voltage rail powering the switched output stage.

4. The amplifier as in claim 1, wherein the input stage produces a modification value based on the feedback; and
    wherein the input stage produces multiple adjusted input signals using the modification value to control a magnitude of the voltage stored in the flying capacitor of the switched output stage.

5. The amplifier as in claim 1, wherein the pulse width modulation stage is a multi-phase pulse width modulation signal generator operable to drive N-phases of switch pairs in the switched output stage; and
    wherein the input stage is operable to individually derive a respective adjusted input signal for each of the N-phases using the feedback.

6. The amplifier as in claim 1, wherein the switched output stage includes: i) a sequence of series connected switches to drive the load, and ii) the flying capacitor coupled to the series connected switches; and
    wherein the feedback indicates a magnitude of the voltage stored in the flying capacitor.

7. The amplifier as in claim 6, wherein the input stage includes:
    an adjustor operable to modify the received input signal based on a magnitude of the error voltage signal.

8. The amplifier as in claim 7, wherein the modification of the received input signal maintains the magnitude of the voltage stored in the flying capacitor to the desired setpoint voltage.

9. The amplifier as in claim 1, wherein the input signal is an audio signal, the output voltage being an amplified rendition of the input signal.

10. The amplifier as in claim 1, wherein the output voltage is a differential output voltage including a first output voltage and a second output voltage; and
    wherein the switched output stage includes: i) a first half bridge circuit operable to produce the first output voltage, and ii) a second half bridge circuit operable to produce the second output voltage;
    wherein the input stage: i) is operable to receive first feedback from the flying capacitor which is coupled to the first half bridge circuit, the flying capacitor being a first flying capacitor, and ii) is operable to receive second feedback from a second flying capacitor coupled to the second half bridge circuit; and
    wherein the input stage is further operable to adjust the input signal, adjustment of the input signal maintaining a magnitude of the a voltage stored in the first flying capacitor and a magnitude of a voltage stored in the second flying capacitor at a desired setpoint voltage.

11. The amplifier as in claim 1, wherein the input stage produces multiple adjusted input signals from the input signal based on the feedback.

12. The amplifier as in claim 11, wherein the multiple adjusted input signals include a respective adjusted input signal for each of multiple current drive phases supported by the pulse width modulation stage.

13. The amplifier as in claim 1, wherein the input stage produces multiple adjusted input signals to control a magnitude of the voltage stored in the flying capacitor.

14. The amplifier as in claim 13, wherein the input stage produces a modification value based on the error voltage signal derived from the feedback; and
wherein the multiple adjusted input signals include a complementary adjustment signal pair including a first adjustment signal and a second adjustment signal, the input stage operable to produce the first adjustment signal as a summation of the input signal and the modification value, the input stage operable to produce the second adjustment signal as a difference between the input signal and the modification value.

15. The amplifier as in claim 1, wherein the voltage is a differential voltage across the flying capacitor; and
wherein the feedback from the switched output stage is the differential voltage.

16. The amplifier as in claim 1 further comprising:
a first switch coupled to a first node of the flying capacitor;
a second switch coupled to a second node of the flying capacitor, the first switch disposed in series with the second switch; and
a common node connecting the first switch and the second switch, the common node producing the output voltage.

17. The amplifier as in claim 16, wherein the feedback includes a first voltage signal and a second voltage signal, a combination of the first voltage signal and the second voltage signal representing the voltage stored in the flying capacitor.

18. The amplifier as in claim 17, wherein the first node provides the first voltage signal to the input stage; and
wherein the second node provides the second voltage signal to the input stage.

19. The amplifier as in claim 18, wherein the input stage is operable to adjust the input signal based on a combination of the first voltage signal and the second voltage signal.

20. The amplifier as in claim 1, wherein the adjusted input signal includes a first adjusted input signal component and a second adjusted input signal component.

21. The amplifier as in claim 20, wherein the first adjusted input signal component is a summation of the input signal and an adjustment value derived from the feedback; and
wherein the second adjusted input signal component is a difference between the input signal and the adjustment value derived from the feedback.

22. The amplifier as in claim 21, wherein the adjustment value is the voltage derived from the voltage stored on the flying capacitor.

23. The amplifier as in claim 1, wherein the adjusted input signal is a differential signal derived from a combination of the input signal and voltage stored in the flying capacitor.

24. A method comprising:
receiving an input signal at an amplifier that drives a load with an output voltage;
producing a modified input signal from the input signal via application of modifications to the input signal, the modifications being based on feedback from a switched output stage of the amplifier, the feedback indicating a voltage of a flying capacitor in the switched output stage of the amplifier;
producing pulse width modulation signals from the modified input signal;
driving the load with the output voltage, the output voltage generated based on the pulse width modulation signals; and
the method further comprising: generating an error voltage signal indicating a difference between the voltage stored in the flying capacitor and a desired setpoint voltage, the input signal adjusted based on the error voltage signal to produce the modified input signal.

25. The method as in claim 24, wherein producing the modified input signal includes:
adjusting the input signal depending upon a magnitude of the voltage of the flying capacitor.

26. The method as in claim 24, wherein the voltage of the flying capacitor is an intermediate voltage used to power the load, a magnitude of the intermediate voltage being a predetermined fraction of a magnitude of a power rail powering the switched output stage.

27. The method as in claim 24, wherein producing the modified input signal includes:
producing a modification value based on the feedback;
producing multiple adjusted input signals using the modification value; and
via the multiple adjusted input signals, controlling a magnitude of the voltage of the flying capacitor.

28. The method as in claim 24, wherein producing the modified input signal includes:
individually deriving a respective adjusted input signal for each of N-phases of switch pairs in the switched output stage using the feedback; and
utilizing the respective adjusted input signals to produce pulse width modulation signals to drive the N-phases of switch pairs in the switched output stage.

29. The method as in claim 24, wherein the input signal is an audio signal, the output voltage being an amplified rendition of the input signal.

30. The method as in claim 24, wherein driving the load with the output voltage based on the pulse width modulation signals includes: driving the load with a differential output voltage, the differential output voltage including a first output voltage generated by a first half bridge circuit and a second output voltage generated by a second half bridge circuit;
wherein application of the modifications to the input signal based on the feedback includes: i) receiving first feedback from a first flying capacitor coupled to the first half bridge circuit, ii) receiving second feedback from a second flying capacitor coupled to the second half bridge circuit, and iii) applying adjustments to the input signal to maintain a voltage across the first flying capacitor and maintain a voltage across the second flying capacitor at a desired setpoint voltage.

31. The method as in claim 25, wherein producing the modified input signal includes: deriving multiple adjusted input signals from the input signal based on the feedback.

32. The method as in claim 31 further comprising:
converting the adjusted input signals into the pulse width modulation signals.

33. The method as in claim 24, wherein producing the modified input signal includes:
producing a modification value based on the feedback;
summing the received input signal and the modification value to produce a first adjusted input signal;
subtracting the modification value from the received input signal to produce a second adjusted input signal, the first adjusted input signal and the second adjusted input signal being a complementary adjustment signal pair; and via the complementary adjustment signal pair, controlling a corresponding set of series connected transistors in the switched output stage driving the load.

34. A method comprising:

receiving an input signal;

applying modifications to the input signal based on feedback from a switched output stage of an amplifier driving a load;

producing pulse width modulation signals from the modified input signal; and driving the load with an output voltage based on the pulse width modulation signals;

wherein applying the modifications to the input signal includes:

comparing the feedback to a desired setpoint voltage, the feedback indicating a magnitude of a voltage across a flying capacitor disposed in the switched output stage;

generating error voltage signal indicating a difference between the magnitude of the voltage across the flying capacitor and the desired setpoint voltage; and producing the adjusted input signal by modifying the received input signal based on the error voltage signal.

35. The method as in claim 34 further comprising:

via the modified input signal, maintaining the magnitude of the voltage across the flying capacitor to the desired setpoint voltage.

\* \* \* \* \*